United States Patent [19]

Bednarz et al.

[11] Patent Number: 4,542,076
[45] Date of Patent: Sep. 17, 1985

[54] METALLIZED MOLDED PLASTIC COMPONENT HOUSINGS FOR SHIELDING AGAINST ELECTROMAGNETIC INTERFERENCE FIELDS

[75] Inventors: Jürgen Bednarz, Penzberg; Wolfgang Lindig, Munich, both of Fed. Rep. of Germany

[73] Assignee: Siemens Aktiengesellschaft, Berlin & Munich, Fed. Rep. of Germany

[21] Appl. No.: 544,885

[22] Filed: Oct. 24, 1983

[30] Foreign Application Priority Data

Dec. 27, 1982 [DE] Fed. Rep. of Germany ....... 3248147

[51] Int. Cl.$^4$ .......................... C23F 1/00; B32B 15/08
[52] U.S. Cl. .................................. 428/624; 428/625; 428/626; 428/161; 174/35 R; 315/85; 455/300
[58] Field of Search ............... 428/161, 625, 626, 624

[56] References Cited

U.S. PATENT DOCUMENTS

| | | | |
|---|---|---|---|
| 1,120,795 | 12/1914 | Daft | 428/625 |
| 2,240,805 | 5/1941 | Semon | 428/625 |
| 2,872,366 | 2/1959 | Kiernan et al. | 428/625 |
| 3,271,119 | 9/1966 | Woodberry | 428/625 |
| 3,898,369 | 8/1975 | Clabburn | 428/36 |
| 4,444,848 | 4/1984 | Shanefield et al. | 428/625 |

Primary Examiner—Veronica O'Keefe
Attorney, Agent, or Firm—Hill, Van Santen, Steadman & Simpson

[57] ABSTRACT

The invention relates to molded pieces of plastic having at least a partial metal coating of their surfaces. The surfaces to be coated are roughened up by means of suitable pretreatment so that a good adhesion of the metal coating on the molded pieces is provided. For the support of this metal coating additionally a cover layer is applied. The molded pieces can also consist of shrinkable material which e.g. are also designed in the form of enveloping objects such as cable fittings.

6 Claims, 1 Drawing Figure

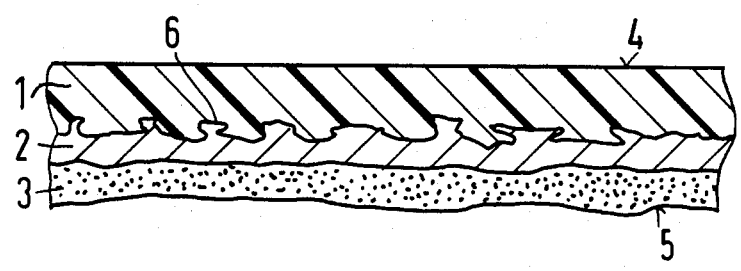

METALLIZED MOLDED PLASTIC COMPONENT HOUSINGS FOR SHIELDING AGAINST ELECTROMAGNETIC INTERFERENCE FIELDS

BACKGROUND OF THE INVENTION

1. Field of the Invention

The invention relates to molded pieces of plastic with at least a partial metal coating of their surfaces, whereby the surfaces are roughened up through pretreatment.

2. Description of the Prior Art

From the German LP 19 09 489 a method is known for the manufacture of molded pieces (of polymers), which can be reset through heat, having a low electric resistance. At least one portion of the resettable molded piece surface therein is coated with a thin film of a metal. The coating is applied in various ways, whereby the surface to be coated is previously correspondingly treated. In spite of a pretreatment of the surface; for example, through roughening-up by means of etching or oxidizing liquids, the danger exists that the metal coating will become at least partially damaged or that it will also separate when the molded parts alter their shape through the shrinking operation.

SUMMARY OF THE INVENTION

It is an objective of the invention to produce molded pieces of plastic with a metal coating in which the metal coating is applied in such a securely adhering fashion that, even in the case of form change of these molded pieces, damage to or a separation of the metal coating does not occur, whereby these surfaces additionally are to receive protection against mechanical influence. The posed objective is achieved in accordance with the invention with molded pieces of plastic with a metal coating in that a cover layer is applied over the metal coating.

A further object of the invention is to provide a method for the manufacture of such molded pieces. A method achieves this further objective in accordance with the invention in that the surface to be coated is first roughened up, that then the metal coating, and that subsequently the cover layer is applied.

The molded pieces according to the invention, in contrast with the cited state of the art and the additional subsequently indicated methods which are known per se, exhibit advantages which considerably simplify the problem of shielding from electromagnetic interference fields. For communication components housings, such as coupling sleeves of PCM-antenna technology and optical waveguide amplifier technology, frequently the shielding of high-frequency electromagnetic interference fields is necessary. It has been determined in accordance with experience that for satisfactory shielding, attenuations of the interfering fields of approximately 50 to 95 dB must be attained. Thus it is known in a general fashion to use metal housings or metal grids or screens for shielding. However, difficulties caused by leakage arise in the points of separation in the housing and in the passages through the housing where special structural measures are required in order to guarantee a satisfactory shielding. The frequency spectrum of the interference field, which generally must be shielded, extends from the kHz to the GHz range.

Also, conductive lacquers for surface treatment of housings are employed generally in the prior art. However, this type of shielding is very expensive and does not satisfy all shielding demands. Moreover, the abrasion resistance of lacquers of this type is very low. A further known application of metals on plastic is the so called flame spraying (Schooping) with metals; for example, zinc, tin, or aluminum. This method is likewise very expensive and gives the housing a rough fissure-susceptible surface. Given the high demands of the attenuation, problems arise due to the nonhomogeneous surface.

A further attempt to obtain a shielding against interference fields goes in the direction of making the plastic molded pieces themselves conductive through additives such as metal or carbon black. However, at present these materials provide no reliable or satisfactory attenuation of the electromagnetic fields in the low frequency range. Finally, metallized, or metal-clad sheets or foils, respectively, and cardboards are known in the art which are employed for attenuation of interference fields. A reliable shielding, such as is required in the case of amplifiers of antenna technology and PCM technology, is, howver, not guaranteed. Moreover, the application requires additional work steps during the assembly. The described attempts at the manufacture of a shielding are of a general type and are so known that further evidence does not appear necessary.

In the case of the present invention, these problems are largely solved. A satisfactory attenuation against interference fields is guaranteed, and the adhesion of the metal plating on the surfaces of the molded pieces which are to be coated, as a consequence of the roughening-up of the surface in conjunction with an additional cover layer on the metal coating, is to be regarded as sufficient. This cover layer can e.g. consist of elastic or plastic material. Preferably, a hot-sealable glue is utilized which is activatable in the presence of heat and provides the metal coating, like the other materials, with a sufficient support. Furthermore, the utilization of electrically conductive material; for example, conductive plastic compounds, is possible. The utilization of such compounds also yields in the regions of introduction a sufficient "electromagnetic seal". The invention also renders possible an economical and reliable shielding against electromagnetic interference fields in the case of component housings pursuant to utilization of the advantages of heat-shrink forming technology.

After the conventional expansion of the molded pieces, the surface of the housing to be coated is pretreated through chemical, physical, or mechanical methods, or through a combination of these three methods. These pretreated surfaces guarantee a sufficient anchoring of the metal coating to be subsequently applied. In the case of the conventional polyolefin compounds, sand-blasting proved optimim for the purpose of roughening up the surface. The subsequent metallization can proceed either through vapor-deposition, metal-plating or galvanizing, chemical metallization, or through application of a conductive lacquer, or also through a combination of these methods. It is furthermore possible to apply or to incorporate metallized webs or meshes on or in the molded pieces to be coated. A chemical pre-copper plating of the molded piece surfaces and a subsequent chemical nickel plating proved especially advantageous. Through the corresponding pretreatment of the molded piece surfaces in the illustrated manner, the metal layer is connected with the plastic in a sufficiently secure and form-locking fashion. Subsequently, the further cover layer is applied on the metal coating, which cover layer consists of elastic, plastic, and/or adhesive materials.

BRIEF DESCRIPTION OF THE DRAWINGS

The FIGURE is schematic side view showing the layers of materials used in accordance with the principles of the present invention.

DESCRIPTION OF THE PREFERRED EMBODIMENTS

In the FIGURE a section of a molded piece 1 is illustrated whose one surface 4, such as a top surface, is left in the normal state, whereas a second surface 6, such as a button surface, is roughened up chemically, physically or mechanically, or by a combination of these methods. For example, the roughening could be by sandblasting or brushing surface 6. This second surface 6 thus exhibits an irregular structure with holes, undercuts, etc. On this roughened up surface 6, a metal coating 2 is applied which enters the uneven locations of the roughened up surface 6 in a form-locking manner and conforms to that surface. The metallization can proceed either through vapor-deposition, metal-plating or galvanizing, chemical metallization or through a combination of these methods. It is also possible to apply or to incorporate metallized webs or meshes on or in the molded pieces to be coated. Several successions metal coatings may also be applied. A chemical pre-copper plating of the molded piece surfaces and a subsequent nickel plating have proven especially advantageous. On this metal coating 2, in accordance with the invention, a cover layer 3, consisting of an elastic, flexible or plastic material, for example, a hot sealable glue layer, is applied which guarantees the metal layer 3 disposed therebelow an additional support.

This support through the cover layer 3 consisting of hot sealable glue is particularly of advantage when the molded piece 1 consists of heat-shrinkable material, since the hot sealable glue layer 3 softens during the shrinkage operation due to heat influence and follows the form change of the molded piece 1. The support effect of the hot sealable glue layer 3 for the metal coating 2 is here of particular advantage since, for example, a separation of the metal coating 2 as a consequence of the over-straining due to the hot sealable glue layer 3 is prevented. After the shrinkage process, the metal coating 2, as a consequence of its good adherence on the plastic piece 1 at surface 6 and due to the support or reinforcement effect of the cover layer 3, remains sufficiently intact for the required shielding effect against electromagnetic interference fields. Separating manifestations, or tearing, of the metal coating 2 during the shrinkage are prevented to the greatest extent in this manner.

In the case of molded pieces 1 which are designed in the form of enveloping objects, such as cable fittings, the cover layer 3 can, for example, consist of a hot sealable glue layer which may possibly also be made electrically conductive. It can in an advantageous manner simultaneously be employed and regarded as a sealing compound at the separation points, whereby an outer surface 5 of the hot sealable glue layer 3 lies against the enveloped subject in a sealing fashion. In the case of cable inlets or sockets of cable fittings the shrinkage fitting can also be directly shrunken down on the introduced cable in the inlet region, whereby, without additional measures, the sealing with the aid of the hot sealable glue coating 3 proceeds immediately. Due to the conductivity of the cover layer 3 simultaneously a satisfactory shield is provided against electromagnetic interference fields. In the case of these enveloping objects, of course, the metal coating 2 and the hot sealable glue coating 3 disposed thereabove, must be arranged on the interior side of the molded pieces. This is moreover, also of advantage in the case of non-shrinkable molded pieces, since then the coatings are protected against mechanical damage.

As is apparent from the foregoing specification, the invention is susceptible of being embodied with various alterations and modifications which may differ particularly from those that have been described in the preceding specification and description. It should be understood that we wish to embody within the scope of the patent warranted hereon all such modifications as reasonably and properly come within the scope of our contribution to the art.

We claim as our invention:

1. Molded pieces of heat shrinkable plastic material having at least a partial metal coating of their surfaces, said surfaces being roughened up through pretreatment, and including a cover layer applied over said metal coating comprising a hot melt adhesive which softens under the influence of heat.

2. Molded pieces according to claim 1, wherein said metal coating and said cover layer are applied in the expanded state of said molded piece.

3. Molded pieces according to claim 1, whereby said molded pieces are designed in the form of enveloping objects, and that said metal coating and said cover layer disposed thereabove are arranged on the interior side of said pieces.

4. Molded pieces according to claim 1, wherein several successive metal coatings are applied to said pieces.

5. Molded pieces according to claim 1, wherein said cover layer consists of electrically conductive material.

6. Formed pieces of heat shrinkable plastic material having an exposed surface,
   said exposed surface being roughened up through pretreatment,
   at least a partial metal coating covering said roughened up surface,
   a cover layer applied over said metal coating,
   said cover layer comprising a hot melt adhesive which softens under the influence of heat, whereby when said formed parts shrink under the influence of heat, said cover layer softens to accomodate the shrinking of said formed parts.

* * * * *